(12) United States Patent
Hays et al.

(10) Patent No.: US 6,252,229 B1
(45) Date of Patent: Jun. 26, 2001

(54) SEALED-CAVITY MICROSTRUCTURE AND MICROBOLOMETER AND ASSOCIATED FABRICATION METHODS

(75) Inventors: Kenneth Maxwell Hays, Santa Ana; Alan Glenn Bisignano, Fountain Valley; Eugene Timothy Fitzgibbons, San Clemente, all of CA (US)

(73) Assignee: Boeing North American, Inc., Seal Beach, CA (US)

( * ) Notice: Subject to any disclaimer, the term of this patent is extended or adjusted under 35 U.S.C. 154(b) by 0 days.

(21) Appl. No.: 09/113,472

(22) Filed: Jul. 10, 1998

(51) Int. Cl.[7] .................................. H01L 31/0203
(52) U.S. Cl. ........................................ 250/338.4
(58) Field of Search ........................... 250/338.4

(56) References Cited

U.S. PATENT DOCUMENTS

| 3,591,839 | * | 7/1971 | Evans .................................. 257/684 |
| 5,091,331 | | 2/1992 | Delgado et al. . |
| 5,420,419 | | 5/1995 | Wood . |
| 5,550,373 | | 8/1996 | Cole et al. . |
| 5,627,112 | | 5/1997 | Tennant et al. . |
| 5,627,396 | | 5/1997 | James et al. . |
| 5,668,033 | | 9/1997 | Ohara et al. . |
| 5,701,008 | | 12/1997 | Ray et al. . |
| 5,841,137 | * | 11/1998 | Whitney ............................. 250/338.5 |
| 5,895,233 | * | 4/1999 | Higashi et al. ....................... 438/107 |
| 6,036,872 | * | 3/2000 | Wood et al. .............................. 216/2 |

FOREIGN PATENT DOCUMENTS 0 599 174 A1   6/1994   (EP) .
0 773 435 A2   5/1997   (EP) .

OTHER PUBLICATIONS

Mori T., et al.: "Vacuum–Encapsulated Thermistor Bolometer Type Miniature Infrared Sensor," Proceeding of the Workshop on Micro–Electro–Mechanical Systems (MEM, OISO, Jan. 25, 1994), Workshop No. 7, pp. 257–262, XP000528426, Institute of Electrical and Electronics Engineers, ISBN: 0–7803–1834–X.

* cited by examiner

Primary Examiner—Constantine Hannaher
(74) Attorney, Agent, or Firm—Alston & Bird LLP

(57) ABSTRACT

A sealed-cavity microstructure and an associated method for manufacturing the microstructure. Specifically, the microstructure includes first and second wafers that are positioned relative to one another so as to form a cavity between the wafers. The microstructure further includes a seal between the first and second wafers and surrounding the cavity to create a pressure seal for the cavity. This seal allows the cavity of the microstructure to be maintained at a predetermined pressure different from that of the atmosphere outside the cavity. Importantly, the microstructure further includes a structural bond between the first and second wafers that structurally integrates the first and second wafers. The structural bond renders the microstructure more rugged such that the microstructure can withstand expansion, vibrational, and shock stresses experienced by the microstructure during subsequent manufacturing and use. In one additional embodiment, the microstructure is a microbolometer that includes in addition to the seal and structural bond, a radiation detector suspended in the cavity.

15 Claims, 4 Drawing Sheets

SEALED-CAVITY MICROSTRUCTURE AND MICROBOLOMETER AND ASSOCIATED FABRICATION METHODS

FIELD OF THE INVENTION

This invention relates generally to sealed-cavity microstructures fabricated using semiconductor fabrication processes and, more particularly, to micro structures having internal cavities sealed with both a pressure seal bond and a structural bond as well as associated fabrication methods.

BACKGROUND OF THE INVENTION

A wide variety of sensors, actuators and other devices may be miniaturized using silicon integrated circuit processing technology. For example, microelectromechanical structures (MEMS) comprise electromechanical devices, such as relays, accelerometers and actuators, formed on a silicon substrate using integrated circuit fabrication processes. MEMS devices and other microstructures promise the benefits of small size, low cost, high quality, high reliability, and low power consumption.

In the fabrication of MEMS and other microstructures, it is sometimes required that two substrates be structurally integrated together, such as by structural bonding. The required structural bonds can be provided by any of several bonding techniques known in the art. For example, a direct bond may be formed by joining two clean, polished surfaces together under compressive force at an elevated temperature. Alternatively, two adjacent solder structures may be integrated by reflowing the solder at an elevated temperature. In addition, an anodic bond may be formed between an insulating substrate and a conducting or semiconducting substrate by the application of a high voltage, such as 1,000 volts, across the junction at an elevated temperature. Structural bonds such as the aforementioned are well developed for providing mechanical integration of two or more microstructures.

In some microstructure applications, a pressure seal may be desired, such as to isolate a cavity internal to a MEMS or other microstructure from the surrounding environment. Pressure seals may be required, for instance, when a high pressure gas atmosphere is desired inside a cavity, such as to increase the breakdown voltage threshold. In other applications, an evacuated cavity may be required, such as for improving the thermal isolation of suspended radiation detectors in a microbolometer. Unfortunately, common structural bonding techniques are generally inadequate to provide pressure sealing because of surface variations and imperfections that preclude the formation of a tight seal across the full extent of a structural bond. It is particularly difficult to provide a tight pressure seal if electrical signals must enter and exit the cavity, such as through electrical feedthrus or wires.

It is known in the art to provide a pressure seal for a microstructure cavity by the deposition of a layer of a deformable metal onto a dielectric seal ring about the periphery of the cavity. For example, gold, tin, lead, or indium may be deposited, such as by sputtering, on a silicon dioxide ring formed on the periphery of two mating wafers to form a sealed-cavity microstructure assembly. When two mating wafers defining a cavity therebetween are joined under moderate compressive force, the deposited metal on the seal ring deforms to adapt to any surface variations and forms a tight seal around the periphery of the cavity formed between the wafers. Unfortunately, pressure seals formed in this manner are not generally structurally sound and devices thus formed are not rugged.

Wafer scale batch processing delivers substantial economies of scale to reduce manufacturing costs in the fabrication of microstructures. It is known in the art to fabricate portions of a plurality of microstructures on each of two wafers that are thereafter structurally bonded to form multiple microstructure devices. The wafers can then be divided into the individual devices after substantially all microstructure fabrication operations have been completed. Conventional sawing or etching operations can be used to accomplish individual device separation at the wafer level. Sealed-cavity microstructures with pressure-tight through-the-seal electrical feedthroughs, however, are not conventionally processed at the wafer level because available pressure seals cannot withstand the required processing.

Unfortunately, microstructures based on evacuated-cavity or pressurized-cavity devices have not been widely adopted in industry because of the high cost to manufacture microstructures with well-sealed cavities in large quantities. Attempts to utilize low-cost wafer-scale batch processing, have generally met with failure due to device design limitations imposed by the lack of an adequate general purpose pressure-tight seal that accommodates through-the-seal electrical feedthroughs and is compatible with wafer-scale batch processing techniques.

A microbolometer focal plane array is a form of MEMS device that uses an array of small radiation detector elements suspended above a semiconductor substrate. As radiated energy, such as infrared energy, is received by each detector element, the temperature of the detector element increases. The resulting temperature-induced change in the resistance of each of the detector elements is detected by a multiplexing integrated circuit formed on the semiconductor substrate. The small radiation detectors of a microbolometer focal plane array are fabricated using micro-machining techniques known in the MEMS art. Microbolometers are generally very sensitive radiation sensors because each of the individual radiation detectors has a very small thermal mass and is thermally isolated from the multiplexing integrated circuit and surrounding structure.

A representative microbolometer array is disclosed by U.S. Pat. No. 5,627,112 to Tennant et al. ("Tennant"). Tennant discloses a multiplexer wafer 124 containing integrated multiplexer circuitry. A wafer 122 on which there is formed an array of radiation detectors is attached to multiplexer wafer 124. The wafer attachment is accomplished by use of a micro-positioning alignment tool which applies force and heat to form compression welds between corresponding columns of indium metal on each of the two wafers. The height of the welded indium columns determines the spacing between the two wafers and thus the separation of the suspended microstructures from the multiplexer. The space between the two wafers is filled with a temporary epoxy, and mechanical lapping and then etching are used to remove the substrate under the radiation detector structures. After the individual thermal detector arrays have been diced apart to form individual devices, a plasma is used to remove the epoxy around and between the individual radiation detector elements in each array. The resulting individual radiation detector elements are free-standing, being connected only to the multiplexer wafer 124. The radiation detectors are not enclosed within a vacuum-sealed cavity.

A vacuum-sealed Fabry-Perot detector microstructure employing a microbolometer is disclosed by U.S. Pat. No. 5,550,373 to Cole et al. ("Cole"). Cole discloses wafer 32 vacuum-sealed to bolometer detector 24 with a continuous support 30 around the perimeter of wafer 32 and the wafer 20 upon which the bolometer detector 24 is mounted. Support 30 encloses microbolometer 12 and Fabry-Perot cavity 18 in a vacuum. The Cole microstructure does not include additional bonding between wafers 20 and 32 and is vacuum-sealed at the individual device level.

Another known microstructure is provided by U.S. Pat. No. 5,701,008 to Ray et al. ("Ray"). Ray discloses infrared detector array pixels 6 inside a vacuum-sealed Dewar microstructure assembly that includes a getter 15 to remove residual gas molecules from the sealed cavity. A seal 8, supporting an infrared window 10, can be formed with indium, tin or lead solder or by a vacuum epoxy. Neither the Cole nor the Ray microstructures include additional bonding between wafers and both are vacuum-sealed at the individual device level.

Conventional sealed-cavity microstructures, therefore, suffer from the limitations discussed above. In particular, conventional structural bonding techniques are inadequate to provide pressure sealing, while conventional pressure seals, conversely, are not structurally sound. In addition, sealed-cavity microstructures, such as conventional vacuum-sealed microbolometers, are not adapted to wafer-level batch processing because the pressure seals cannot withstand the required processing environments. Further attempts to fabricate microstructures having sealed cavity by means of low-cost wafer-scale batch processing have generally met with failure due to mutually exclusive materials and process requirements. As a result, microstructures with well-sealed cavities are expensive to produce and have not been widely adopted in industry.

SUMMARY OF THE INVENTION

It is an object of the present invention to provide a sealed-cavity microstructure, and an associated fabrication method, which incorporates both a tight pressure seal and a rugged structural bond to enable low-cost wafer-scale batch processing.

It is a further object of the present invention to provide a rugged vacuum-cavity microbolometer, and an associated fabrication method, adapted to be produced using low-cost wafer-scale batch processing.

These and other objects are provided, according to the present invention, by a method of fabricating a microstructure with at least one pressure-maintained cavity, which joins first and second wafers such that a recessed portion of at least one of the wafers forms a cavity therebetween and which thereafter forms both a pressure seal and a structural bond about the cavity. The resulting microstructure is structurally integrated as a result of the structural bond and includes an internal cavity that can be maintained at a pre-determined pressure due to the surrounding pressure seal. Thus, not only is the resulting microstructure rugged, but the method of the present invention facilitates lower cost wafer-style batch processing of microstructures having pressure-maintained cavities.

In one embodiment of the invention, at least one of the wafers defines a seal ring that extends peripherally about the cavity. By depositing a deformable metal on the seal ring, the pressure seal can be formed on the seal ring as the first and second wafers are brought together. In addition, the structural bond, such as an anodic bond, a direct bond, a micro-velcro bond or a solder bond, can be formed outside of and peripherally about at least a portion of the seal ring to structural integrate at least portions of the first and second wafers.

A microbolometer is also provided according to the invention that includes first and second wafers defining a cavity therebetween, at least one radiation detector suspended within the cavity, a vacuum seal between the two wafers that extends peripherally about the cavity to maintain a vacuum within the cavity, and a structural bond between the two wafers to structurally integrate at least portions of the two wafers.

The microstructure and associated fabrication methods of the present invention therefore overcome limitations imposed by conventional sealed-cavity microstructures. In particular, a sealed-cavity microstructure is provided that incorporates both a tight pressure seal and a rugged structural bond. A sealed-cavity microstructure and a vacuum-cavity microbolometer are thereby provided that are adapted to low-cost wafer-scale batch processing.

DETAILED DESCRIPTION OF THE INVENTION

The present invention will now be described more fully with reference to the accompanying drawings, in which preferred embodiments of the invention are shown. This invention may, however, be embodied in many different forms and should not be construed as limited to the embodiments set forth here; rather, these embodiments are provided so that this disclosure will be thorough and complete and will fully convey the scope of the invention to those skilled in the art. Like numbers refer to like elements throughout.

Figure 1:
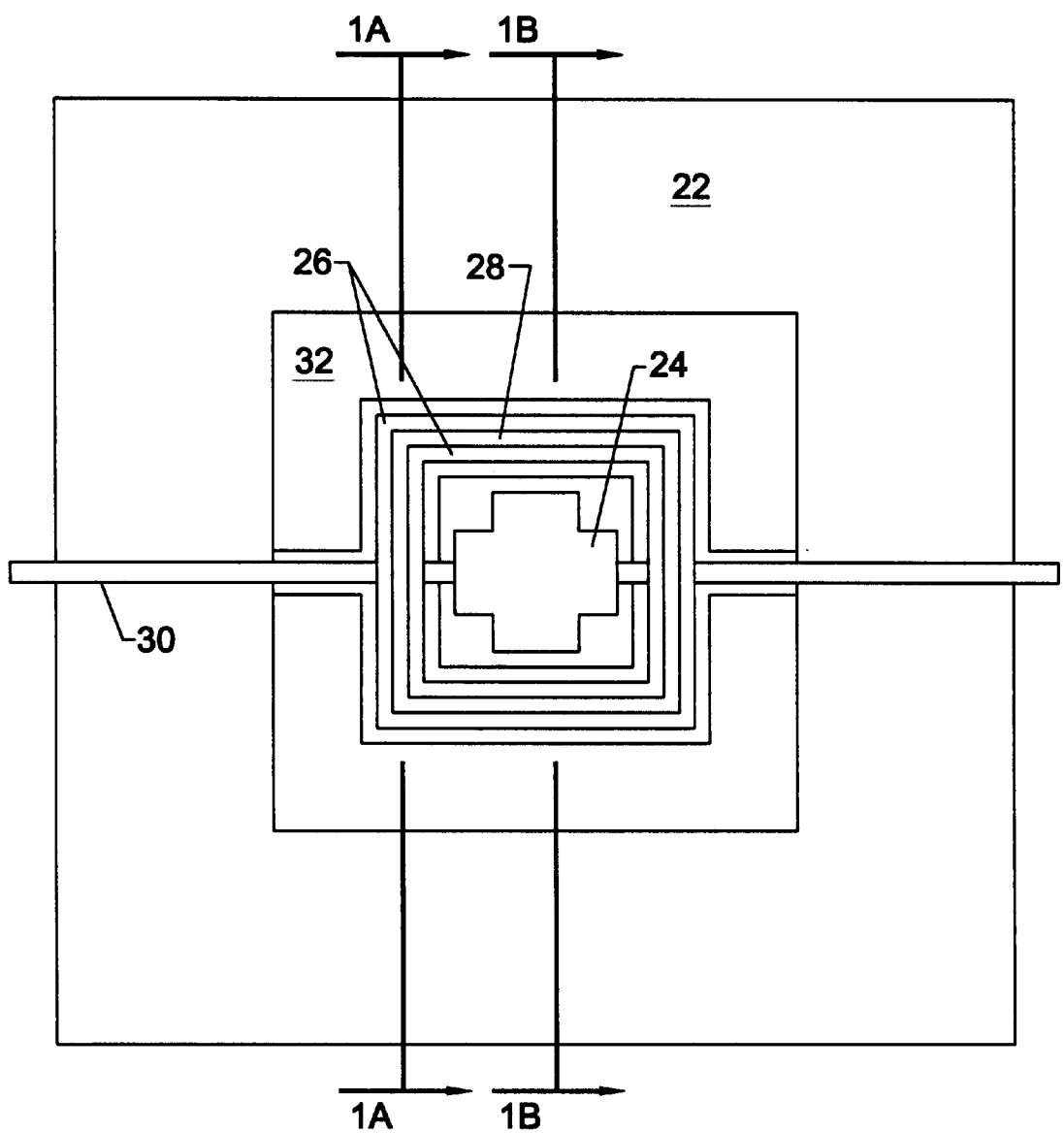
FIG. 1 is a plan view of a generic silicon pressure-sealed microstructure device according to one embodiment of the present invention.
Figure 1A:
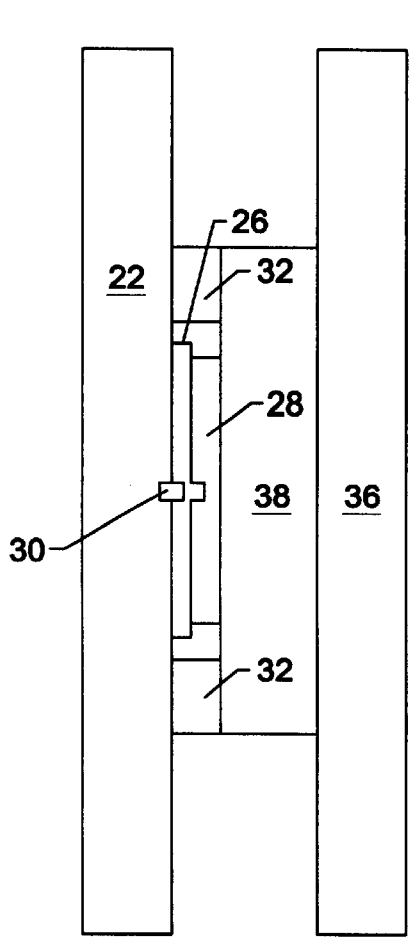
FIG. 1A is a cross-sectional view taken along line 1A–1A of FIG. 1 through the pressure seal region of the generic pressure-sealed microstructure of one embodiment of the present invention.
Figure 1B:
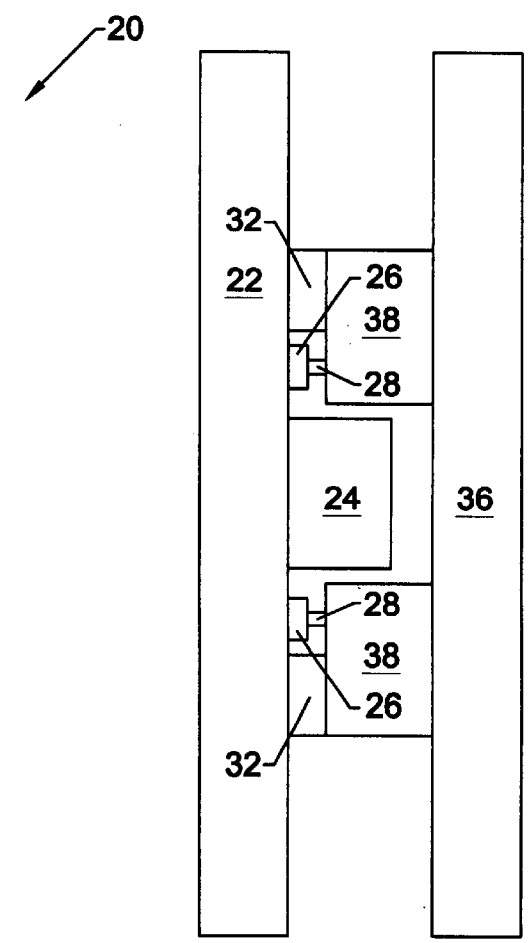
FIG. 1B is a cross-sectional view taken along line 1B–1B of FIG. 1 through the center of the generic pressure-sealed microstructure of one embodiment of the present invention depicting structural bond and pressure seal structures.

Referring now to FIGS. 1, 1A and 1B, a generic microstructure 20 according to one embodiment of the present invention is shown. The microstructure includes a substrate 22 and a device 24, such as a MEMS device, fabricated on substrate 22 using fabrication processes and materials well known to those versed in the art. The microstructure also includes cap 36 that is joined to substrate 22 to form a cavity surrounding device 24. In this regard, the cap includes a recessed cavity that is aligned with and receives the device. Alternatively, the cap can have a generally planar inner surface and the substrate can include a recessed cavity in which the device is disposed. In either instance, the atmosphere in the cavity is maintained at a pre-determined pressure, such as at a vacuum or at high pressure, according to device design requirements. Either the substrate 22 or the cap 36 preferably defines a seal ring 26 that extends circumferentially about the periphery of the cavity and that extends outwardly beyond adjacent portions of the substrate of the cap. For example, the seal ring 26 can be formed by the deposition of a dielectric material on substrate 22. While the seal ring 26 will hereinafter be described as being formed on the substrate 22, portions of the seal ring can be formed on corresponding parts of the substrate 22 and the cap 36 without departing from the spirit and scope of the present invention.

Seal metal 28 is then deposited on seal ring 26. Preferably, seal metal 28 is formed by depositing a deformable metal, such as gold, tin, lead, or indium, on seal ring 26 to a depth of about 0.5 micrometers. For example, the deformable metal can be deposited by sputtering. When cap 36 is joined to substrate 22 under moderate compressive force, seal metal 28 on seal ring 26 deforms so that any gaps or other surface imperfections at the interface between seal ring 26 and cap 36 are filled with the deformable seal metal 28. A tight pressure seal around device 24 is thereby formed such that the atmosphere in the cavity can be maintained at a predetermined pressure.

Unfortunately, the pressure seal around device 24 is not structurally sound enough for microstructure 20 to withstand loads experienced in subsequent wafer-sawing die separation operations or in many end-use applications without further reinforcement. For example, a MEMS device for an automotive application must withstand severe temperature extremes and vibration and shock loads. To provide the requisite structural integrity, the microstructure of the present invention also includes a structural bond that is formed circumferentially about at least portions of the cavity. In this regard, the structural bond need not extend continuously about the cavity since the structural bond is not intended to create a continuous seal, but is, instead, intended to structurally integrate portions of the substrate and the cap. For example, a rugged structural bond may be formed by bonding at only a few points beyond the perimeter of seal ring 26.

While the structural bond can be formed between the substrate and the cap in a number of different manners, the microstructure of one advantageous embodiment includes a structural bond formed at the interface between substrate bond feature 32 and cap bond feature 38 which extend outwardly from portions of the substrate and the cap, respectively, and which extend peripherally about the cavity. The structural bond may be formed by any of several structural bond techniques known in the art. For example, an anodic bond may be formed by applying a DC voltage, such as 950 volts, across the interface between substrate bond feature 32 and cap bond feature 38 at an elevated temperature, such as 350° C. Alternatively, a direct bond may be formed by joining substrate bond feature 32 and cap bond feature 38 under moderate compressive force at an elevated temperature such as 1100° C. Moreover, a structural bond may also be formed by micro-velcro bonding or by soldering, as is known in the art. Soldering requires that appropriate solder materials such as tin, lead, indium, etc. must be deposited on at least one of the surfaces and that the mating surface be wettable with the solder material; this can be achieved by coating the mating surface or by cleaning or chemical preparation. Micro-velcro bonding requires etching and patterning of both surfaces. The term micro-velcro bonding as used herein is a term of art used in the technical field to describe a bond that is similar to a velvet-crochet bond for microstructures. This bond is also sometimes referred to as a micromechanical velcro bond. As known in the art, a micro-velcro bond is made by forming interlocking connectors on both surfaces of the wafers to be bonded and forcing the connectors to inter-lock using force. The term is not used in the sense of the trademark VELCRO, which is used to identify the source of a wide variety of goods and materials that use velvet-crochet bonds made, sold, or licensed by Velcro Industry BV located in the Netherlands.

Electrical leads 30 may be passed out of the cavity through the seal metal 28 as shown in FIG. 1A without adversely affecting the predetermined pressure within the cavity. In this regard, the pressure seal of the present invention is provided by the deformable metal that fills around discontinuities in the seal, such as the discontinuity created by the passage of an electrical lead 30 through the seal. In addition, the electrical leads can pass between those portions of the substrate and the cap that are structurally bonded since the structural bond generally does not extend continuously about the cavity.

So that the atmosphere within the cavity surrounding device 24 may be maintained at a predetermined pressure, it is preferable that the structural bond between substrate 22 and cap 36 be formed outside of the periphery of seal ring 26. It is also preferable that the structural bond be made simultaneously with the pressure seal or made after the pressure seal has been formed; otherwise, an imperfect seal created by the structural bond may make it difficult to evacuate or otherwise control the atmosphere within the cavity surrounding device 24 prior to sealing.

To ensure a tight pressure seal at seal ring 26, it is important that the relative heights of seal ring 26 and substrate bond feature 32 above substrate 22 be controlled as tightly as possible. In this regard, substrate bond feature 32 may be formed by etching away surrounding substrate material or by deposition of new material on an otherwise generally planar substrate 22. Seal ring 26 may be formed by depositing and patterning silicon dioxide over substrate 22 and electrical leads 30 to form a ring of silicon dioxide, for example. With known fabrication techniques, it is possible to control the relative heights of seal ring 26 and substrate bond feature 32 to be within 0.05 micrometers of the desired height offset the thickness of compressed seal metal 28 between them. As shown in FIG. 1B, this desired height offset is preferably equal to 0.15 micrometers. Alternatively, substrate bond feature 32 may be eliminated and an equivalent bond feature, with a height to compensate for the height of seal ring 26 and seal metal 28, may be formed on cap 36, as mentioned above.

Figure 2:
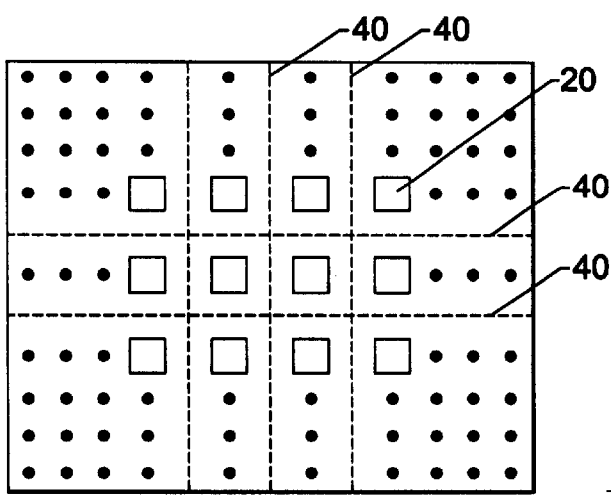
FIG. 2 is a schematic wafer-scale plan view indicating the batch fabrication of multiple microstructure devices on a single wafer.

In order to manufacture microstructures 20 in a cost-effective manner, it is important that wafer-scale processing techniques be utilized. FIG. 2 shows a set of microstructures 20 constructed by combining a substrate wafer and a cap wafer to define a plurality of cavities within which individual devices 24 are located. Once substantially all processing steps have been completed, including the steps of forming a pressure seal and forming a structural bond about each respective cavity, individual devices may be separated from one another by dicing the structurally integrated wafer, such as by sawing or etching.

A significant advantage of the use of sealing at the wafer level in vacuum seal applications is that the process is inherently much cleaner than for sealing at the individual device level. As a result, the use of getter materials inside the cavity to maintain a good vacuum may be avoided by practicing the method of the present invention.

Figure 3:
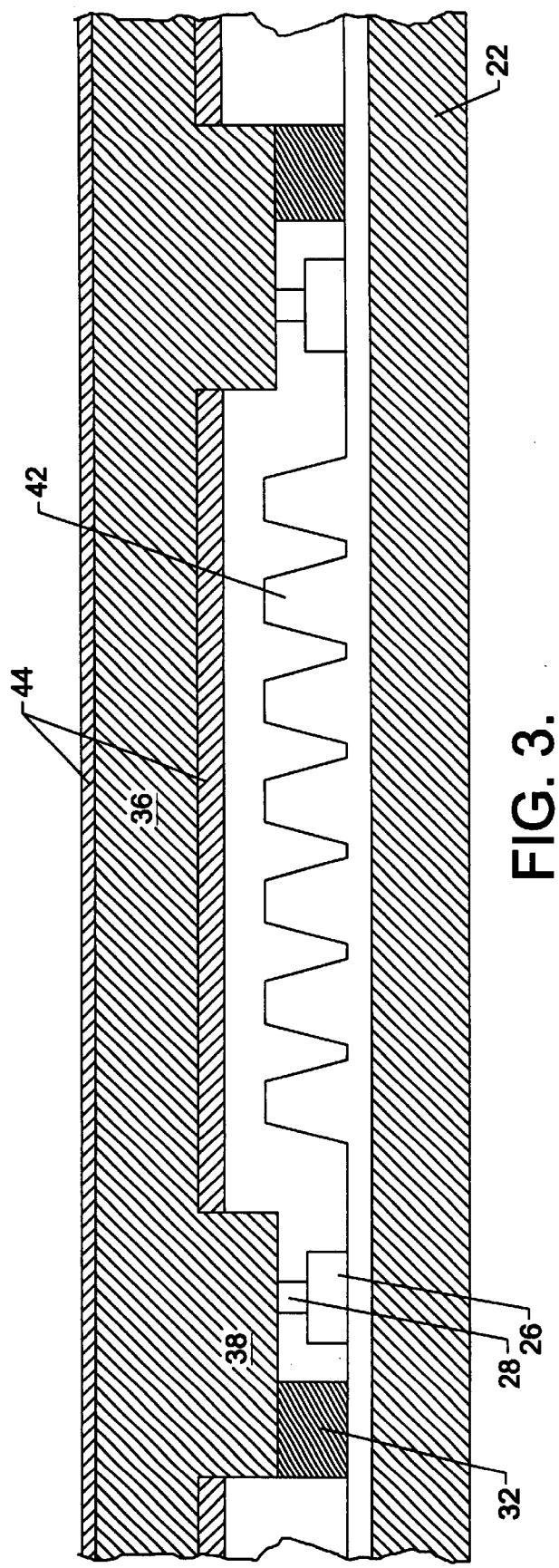
FIG. 3 is a cross-sectional view through a vacuum-sealed microbolometer of one advantageous embodiment of the present invention.

In one embodiment of the present invention, a microbolometer is provided as shown in FIG. 3. The microbolometer comprises an array 42 of suspended radiation detectors formed on substrate 22 by micro-machining techniques. As the individual detector elements absorb radiation, such as infrared radiation, they heat up and the resistance of the elements changes. The microbolometer also includes a multiplexer circuit integrated into substrate 22 to monitor the change in resistance of each of the detector elements and to determine thereby the amount of radiation received by the microbolometer. To thermally isolate the individual detector elements from surrounding structures, an evacuated atmosphere in the cavity is desired. According to the present invention, the microbolometer includes a seal ring 26 extending outwardly from the substrate 22 about the circumference of the cavity. As described above, seal metal 28 deposited on seal ring 26 provides a tight pressure seal permitting a vacuum atmosphere to be maintained. In addition to pressure sealing, an anodic bonding or other aforementioned structural bonding process well known in the art is used to formed a rugged structural bond between cap 36 and substrate 22 in the same fashion as described above. To improve performance, the microbolometer also includes an anti-reflective coating on outer and inner surfaces of cap 36. The anti-reflective coating permits transmission of the radiation to be detected, such as an infrared anti-reflective coating 44, for a microbolometer designed to detect infrared radiation. According to the present invention, a plurality of microbolometers may be formed at the wafer level, with pressure seals and structural bonds formed at the wafer level about each respective cavity in which a microbolometer is disposed, before dividing the individual microbolometer devices by sawing or etching the structurally integrated wafer.

Figure 4:
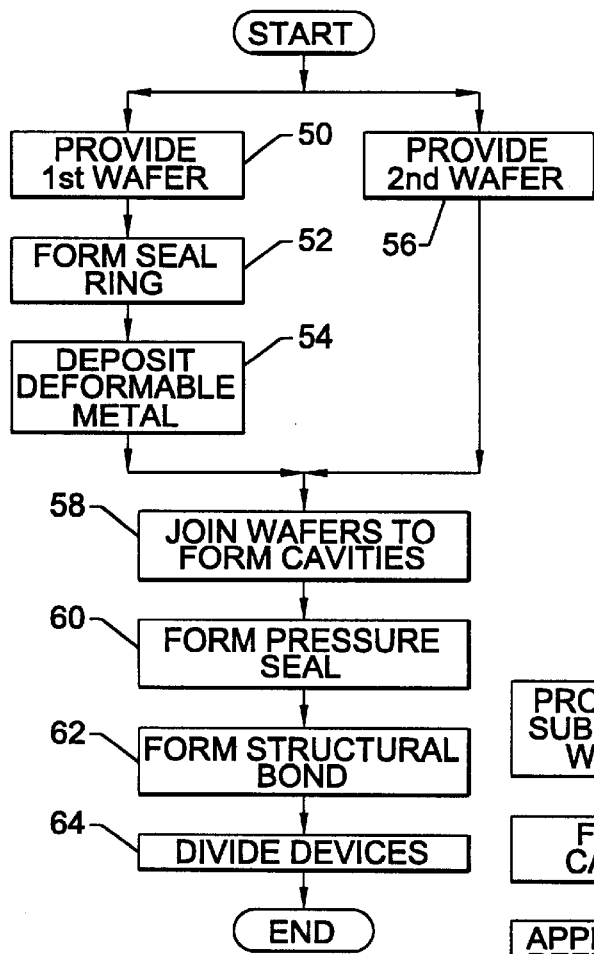
FIG. 4 is a flow diagram illustrating the operations performed to fabricate a microstructure according to one embodiment of the present invention.

FIG. 4 is a flow diagram illustrating the operations performed to fabricate a plurality of microstructures at the wafer level according to one embodiment of the present invention. As shown in blocks 50–54, a first wafer is provided and a dielectric seal ring is formed thereon, after which a deformable metal is deposited on the seal ring. A second wafer is also provided as shown in block 56. Since the inner surface of at least one of the first and second wafers includes a plurality of recesses, the joining of the two wafers forms a plurality individual cavities within which MEMS or other devices are located. See block 58. Pressure seals are formed at the seal rings around the perimeter of each of the cavities. See block 60. Structural bonds outside of the perimeter of each of the seal rings are also formed to create a plurality of ruggedized, pressure-sealed microstructures. See block 62. Individual devices are then divided at the wafer level; such as by sawing or etching the structurally integrated wafer. See block 64.

Figure 5:
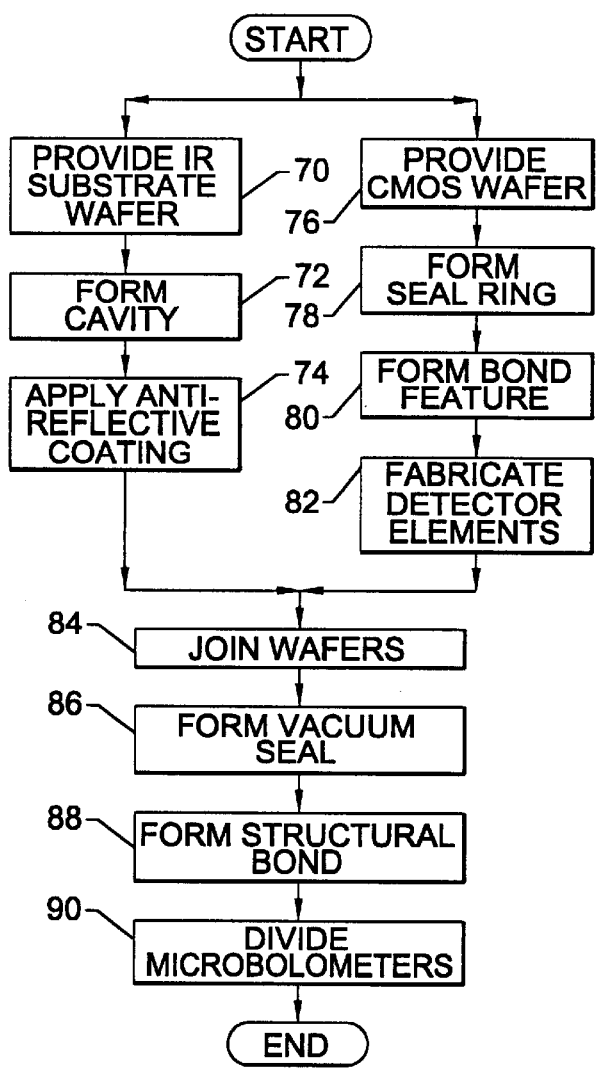
FIG. 5 is a flow diagram illustrating the operations performed to fabricate a microstructure according to another embodiment of the present invention.

FIG. 5 is a flow diagram illustrating the operations performed to fabricate a plurality of microbolometers at the wafer level according to another embodiment of the present invention. As shown in blocks 70–74, an infrared-transmissive cap wafer is provided, a cavity is formed thereon, and an anti-reflective coating is applied thereto. A substrate wafer, such as a CMOS wafer, is also provided and a seal ring and bond features are formed thereon as shown in blocks 76–80. Individual microbolometer detector elements are then fabricated on the CMOS wafer in locations corresponding to respective ones of the cavities in the cap wafer. See block 82. The CMOS wafer and the infrared-transmissive cap wafer are then joined such that detector elements reside in respective ones of the cavities as shown in block 84. Vacuum or pressure seals are then formed on the seal rings surrounding each of the cavities, and structural bonds are formed that extend at least partially around each of the seal rings to structurally integrate the CMOS wafer and the infrared-transmissive cap wafer. See blocks 86 and 88. Individual microbolometers are then divided at the wafer level; such as by sawing or etching the structurally integrated wafer. See block 90.

The microstructure 20 and the associated fabrication methods of the present invention overcome limitations imposed by conventional sealed cavity microstructures. In particular, a sealed cavity microstructure 20 is provided that incorporates both a tight pressure seal and a rugged structural bond. A sealed cavity microstructure 20 and a vacuum cavity microbolometer are thereby provided that are adapted to low-cost wafer-scale batch processing.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed is:

1. A microstructure with at least one pressure-maintained cavity, said microstructure comprising:

first and second wafers defining a cavity therebetween;

a pressure seal between said first and second wafers that extends peripherally about the cavity to maintain a pre-determined pressure within said cavity; and a structural bond between said first and second wafers to structurally integrate at least a portion of said first and second wafers, wherein said structural bond provides sufficient support to said first and second wafers such that said pressure seal is maintained intact during subsequent manufacture and use of the said microstructure.

2. The microstructure of claim 1 wherein said pressure seal comprises a deformable metal deposited on at least one of said first and second wafers.

3. The microstructure of claim 2 wherein said deformable metal comprises at least one metal selected from the group consisting of gold, tin, lead and indium.

4. The microstructure of claim 1 wherein at least one of said first and second wafers defines a seal ring extending peripherally about the cavity.

5. The microstructure of claim 4 wherein said seal ring comprises a dielectric material.

6. The microstructure of claim 1 wherein said structural bond is selected from the group consisting of an anodic bond, a direct bond, a micro-velcro bond, and a soldered bond.

7. The microstructure of claim 1 further comprising a MEMS device disposed within the cavity defined by said first and second wafers.

8. The microstructure of claim 1 further comprising a microbolometer including an array of radiation detectors within the cavity.

9. A microstructure with at least one pressure-maintained cavity, said microstructure comprising:

first and second wafers defining a cavity therebetween:

a pressure seal between said first and second wafers that extends peripherally about the cavity to maintain a pre-determined pressure within said cavity; and a structural bond between said first and second wafers to structurally integrate at least a portion of said first and second wafers,
    wherein at least one of said first and second wafers defines a seal ring that extends peripherally about the cavity, wherein the pressure seal comprises a deformable metal deposited on the seal ring, and wherein the structural bond comprises a structural bond formed outside of and peripherally about at least a portion of the seal ring.

10. A microbolometer comprising:

first and second wafers defining a cavity therebetween;

at least one radiation detector suspended within the cavity;

a vacuum seal between said first and second wafers that extends peripherally about the cavity to maintain a vacuum within said cavity; and a structural bond between said first and second wafers to structurally integrate at least a portion of said first and second wafers, wherein said structural bond provides sufficient support to said first and second wafers such that said vacuum seal is maintained intact during subsequent manufacture and use of the said microbolometer.

11. The microbolometer of claim 10 wherein at least one of said first and second wafers further comprises an electrical circuit adapted to sense the temperature of said at least one radiation detector.

12. The microbolometer of claim 10 wherein at least one of said first and second wafers further comprises an antireflective coating.

13. A microstructure with at least one pressure-maintained cavity, said microstructure comprising:

first and second wafers defining a cavity therebetween;

a pressure seal between said first and second wafers that extends peripherally about the cavity to maintain a pre-determined pressure within said cavity; and a structural bond between said first and second wafers to structurally integrate at least a portion of said first and second wafers, wherein said structural bond is formed outside of and peripherally about at least a portion of said pressure seal.

14. A microbolometer comprising:

first and second wafers defining a cavity therebetween;

at least one radiation detector suspended within the cavity;

a vacuum seal between said first and second wafers that extends peripherally about the cavity to maintain a vacuum within said cavity; and a structural bond between said first and second wafers to structurally integrate at least a portion of said first and second wafers,
    wherein at least one of said first and second wafers defines a seal ring that extends peripherally about the cavity, wherein said vacuum seal comprises a deformable metal deposited on the seal ring, and wherein said structural bond is formed outside of and peripherally about at least a portion of said seal ring.

15. A microbolometer comprising:

first and second wafers defining a cavity therebetween;

at least one radiation detector suspended within the cavity;

a vacuum seal between said first and second wafers that extends peripherally about the cavity to maintain a vacuum within said cavity; and a structural bond between said first and second wafers to structurally integrate at least a portion of said first and second wafers, wherein said structural bond is formed outside of and peripherally about at least a portion of said vacuum seal.

* * * * *